United States Patent
Seng et al.

(10) Patent No.: US 7,250,328 B2
(45) Date of Patent: Jul. 31, 2007

(54) MICROELECTRONIC COMPONENT ASSEMBLIES WITH RECESSED WIRE BONDS AND METHODS OF MAKING SAME

(75) Inventors: Erin Tan Swee Seng, Singapore (SG); Edmund Low Kwok Chung, Singapore (SG)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 10/929,640

(22) Filed: Aug. 30, 2004

(65) Prior Publication Data

US 2006/0017177 A1     Jan. 26, 2006

(30) Foreign Application Priority Data

Jul. 23, 2004   (SG)   ............................ 200404238-8

(51) Int. Cl.
*H01L 21/00* (2006.01)
*H01L 21/66* (2006.01)
*H01L 23/28* (2006.01)
*H01L 23/29* (2006.01)

(52) U.S. Cl. ........................... 438/106; 438/15; 438/25; 438/112; 438/127; 257/787; 257/788; 257/E23.128

(58) Field of Classification Search ................ 438/612, 438/617, 15, 25, 26, 51, 55, 64, 112, 124, 438/126, 127, 106; 257/E23.033, 787, 788, 257/667, E23.116, E23.123, E23.128
See application file for complete search history.

(56) References Cited

U.S. PATENT DOCUMENTS 5,062,565 A   11/1991   Wood et al.
5,128,831 A   7/1992   Fox, III et al.
5,593,927 A   1/1997   Farnworth et al.
5,677,566 A   10/1997   King et al.
5,696,033 A   12/1997   Kinsman
5,739,585 A   4/1998   Akram et al.
D394,844 S   6/1998   Farnworth et al.
5,818,698 A * 10/1998   Corisis ....................... 361/760
D102,638 S   12/1998   Farnworth et al.

(Continued)

FOREIGN PATENT DOCUMENTS

EP   0921569 A1   6/1999

(Continued)

OTHER PUBLICATIONS

Search Report and Written Opinion for Singapore Patent Application No. SG200404238-8, 10 pages, Mar. 1, 2006.

*Primary Examiner*—Long K. Tran
(74) *Attorney, Agent, or Firm*—Perkins Coie LLP

(57) ABSTRACT

The present disclosure suggests various microelectronic component assembly designs and methods for manufacturing microelectronic component assemblies. In one particular implementation, a microelectronic component assembly includes a microelectronic component, a substrate, and at least one bond wire. The substrate has a reduced-thickness base adjacent terminals of the microelectronic component and a body having a contact surface spaced farther from the microelectronic component than a bond pad surface of the base. The bond wire couples the microelectronic component to a bond pad carried by the bond pad surface and has a maximum height outwardly from the microelectronic component that is no greater than the height of the contact surface from the microelectronic component.

20 Claims, 2 Drawing Sheets

U.S. PATENT DOCUMENTS

| | | | |
|---|---|---|---|
| 5,851,845 A | 12/1998 | Wood et al. | |
| 5,891,753 A | 4/1999 | Akram | |
| 5,891,797 A | 4/1999 | Farrar | |
| 5,893,726 A | 4/1999 | Farnworth et al. | |
| 5,894,218 A | 4/1999 | Farnworth et al. | |
| 5,898,224 A | 4/1999 | Akram | |
| 5,933,713 A | 8/1999 | Farnworth | |
| 5,938,956 A | 8/1999 | Hembree et al. | |
| 5,946,553 A | 8/1999 | Wood et al. | |
| 5,958,100 A | 9/1999 | Farnworth et al. | |
| 5,986,209 A | 11/1999 | Tandy | |
| 5,989,941 A | 11/1999 | Wensel | |
| 5,990,566 A | 11/1999 | Farnworth et al. | |
| 5,994,784 A | 11/1999 | Ahmad | |
| RE36,469 E | 12/1999 | Wood et al. | |
| 5,998,860 A * | 12/1999 | Chan et al. | 257/679 |
| 6,008,070 A | 12/1999 | Farnworth | |
| 6,008,074 A | 12/1999 | Brand | |
| 6,018,249 A | 1/2000 | Akram et al. | |
| 6,020,624 A | 2/2000 | Wood et al. | |
| 6,020,629 A | 2/2000 | Farnworth et al. | |
| 6,025,728 A | 2/2000 | Hembree et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,049,129 A * | 4/2000 | Yew et al. | 257/737 |
| 6,064,194 A | 5/2000 | Farnworth et al. | |
| 6,072,233 A | 6/2000 | Corisis et al. | |
| 6,072,236 A | 6/2000 | Akram et al. | |
| 6,075,288 A | 6/2000 | Akram | |
| 6,087,203 A * | 7/2000 | Eng et al. | 438/118 |
| 6,089,920 A | 7/2000 | Farnworth et al. | |
| 6,097,087 A | 8/2000 | Farnworth et al. | |
| 6,103,547 A | 8/2000 | Corisis et al. | |
| 6,107,122 A | 8/2000 | Wood et al. | |
| 6,107,680 A | 8/2000 | Hodges | |
| 6,117,382 A | 9/2000 | Thummel | |
| 6,124,634 A | 9/2000 | Akram et al. | |
| 6,130,474 A | 10/2000 | Corisis | |
| 6,148,509 A | 11/2000 | Schoenfeld et al. | |
| 6,150,717 A | 11/2000 | Wood et al. | |
| 6,153,924 A | 11/2000 | Kinsman | |
| 6,159,764 A | 12/2000 | Kinsman et al. | |
| 6,172,419 B1 | 1/2001 | Kinsman | |
| 6,184,465 B1 | 2/2001 | Corisis | |
| 6,188,232 B1 | 2/2001 | Akram et al. | |
| 6,198,172 B1 | 3/2001 | King et al. | |
| 6,201,304 B1 | 3/2001 | Moden | |
| 6,208,519 B1 | 3/2001 | Jiang et al. | |
| 6,210,992 B1 | 4/2001 | Tandy et al. | |
| 6,214,716 B1 | 4/2001 | Akram | |
| 6,215,175 B1 | 4/2001 | Kinsman | |
| 6,225,689 B1 | 5/2001 | Moden et al. | |
| 6,228,548 B1 | 5/2001 | King et al. | |
| 6,229,202 B1 | 5/2001 | Corisis | |
| 6,232,666 B1 | 5/2001 | Corisis et al. | |
| 6,235,554 B1 * | 5/2001 | Akram et al. | 438/109 |
| 6,239,489 B1 | 5/2001 | Jiang | |
| 6,246,108 B1 | 6/2001 | Corisis et al. | |
| 6,247,629 B1 | 6/2001 | Jacobson et al. | |
| 6,249,052 B1 * | 6/2001 | Lin | 257/737 |
| 6,252,308 B1 | 6/2001 | Akram et al. | |
| 6,252,772 B1 | 6/2001 | Allen | |
| 6,258,623 B1 | 7/2001 | Moden et al. | |
| 6,258,624 B1 | 7/2001 | Corisis | |
| 6,259,153 B1 | 7/2001 | Corisis | |
| 6,261,865 B1 | 7/2001 | Akram | |
| 6,265,766 B1 * | 7/2001 | Moden | 257/678 |
| 6,277,671 B1 | 8/2001 | Tripard | |
| 6,281,042 B1 | 8/2001 | Ahn et al. | |
| 6,284,571 B1 | 9/2001 | Corisis et al. | |
| 6,285,204 B1 | 9/2001 | Farnworth | |
| 6,291,894 B1 | 9/2001 | Farnworth et al. | |
| 6,294,825 B1 * | 9/2001 | Bolken et al. | 257/676 |
| 6,294,839 B1 | 9/2001 | Mess et al. | |
| 6,297,547 B1 | 10/2001 | Akram | |
| 6,303,981 B1 | 10/2001 | Moden | |
| 6,303,985 B1 | 10/2001 | Larson et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,329,222 B1 | 12/2001 | Corisis et al. | |
| 6,331,221 B1 | 12/2001 | Cobbley | |
| 6,331,453 B1 | 12/2001 | Bolken et al. | |
| 6,332,766 B1 | 12/2001 | Thummel | |
| 6,365,434 B1 | 4/2002 | Rumsey et al. | |
| 6,385,049 B1 * | 5/2002 | Chia-Yu et al. | 361/721 |
| 6,429,528 B1 | 8/2002 | King et al. | |
| 6,437,586 B1 | 8/2002 | Robinson | |
| 6,451,709 B1 | 9/2002 | Hembree | |
| 6,483,044 B1 | 11/2002 | Ahmad | |
| 6,548,757 B1 | 4/2003 | Russell et al. | |
| 6,552,910 B1 | 4/2003 | Moon et al. | |
| 6,558,600 B1 | 5/2003 | Williams et al. | |
| 6,561,479 B1 | 5/2003 | Eldridge | |
| 6,564,979 B2 | 5/2003 | Savaria | |
| 6,576,494 B1 | 6/2003 | Farnworth | |
| 6,576,495 B1 | 6/2003 | Jiang et al. | |
| 6,589,820 B1 | 7/2003 | Bolken | |
| 6,614,092 B2 | 9/2003 | Eldridge et al. | |
| 6,622,380 B1 | 9/2003 | Grigg | |
| 6,638,595 B2 | 10/2003 | Rumsey et al. | |
| 6,644,949 B2 | 11/2003 | Rumsey et al. | |
| 6,650,013 B2 | 11/2003 | Yin et al. | |
| 6,653,173 B2 | 11/2003 | Bolken | |
| 6,670,719 B2 | 12/2003 | Eldridge et al. | |
| 6,672,325 B2 | 1/2004 | Eldridge | |
| 6,673,649 B1 | 1/2004 | Hiatt et al. | |

FOREIGN PATENT DOCUMENTS

| | | | |
|---|---|---|---|
| JP | 2000-307032 A | 11/2000 | |

* cited by examiner

MICROELECTRONIC COMPONENT ASSEMBLIES WITH RECESSED WIRE BONDS AND METHODS OF MAKING SAME

CROSS-REFERENCE TO RELATED APPLICATION

This application claims foreign priority benefits of Singapore Application No. 200404238-8 filed Jul. 23, 2004, in the name of Micron Technology, Inc., and entitled "MICROELECTRONIC COMPONENT ASSEMBLIES WITH RECESSED WIRED BONDS AND METHODS OF MAKING SAME," the entirety of which is incorporated herein by reference.

TECHNICAL FIELD

The present invention relates to microelectronic components. In particular, aspects of the invention relate to microelectronic component assemblies and methods of manufacturing microelectronic component assemblies. Certain embodiments of the invention provide packaged microelectronic component assemblies.

BACKGROUND

Semiconductor chips or dies typically are manufactured from a semiconductor material such as silicon, germanium, or gallium/arsenide. An integrated circuit or other active feature(s) is incorporated in the die adjacent one surface, often referred to as the "active surface," of the die. The active surface typically also includes input and output terminals to facilitate electrical connection of the die with another microelectronic component.

Since semiconductor dies can be degraded by exposure to moisture and other chemical attack, most dies are encapsulated in a package that protects the dies from the surrounding environment. The packages typically include leads or other connection points that allow the encapsulated die to be electrically coupled to another electronic component, e.g., a printed circuit board. One common package design, referred to as a board-on-chip (BOC) package, includes a semiconductor die attached to a small circuit board, e.g., via a die attach adhesive. Some or all of the terminals of the semiconductor die then may be electrically be connected to a first set of contacts of the board, e.g., by wire bonding. The connected board and die may then be encapsulated in a mold compound to complete the packaged microelectronic component assembly. A second set of contacts carried on an outer surface of the board remain exposed; these exposed contacts are electrically connected to the first contacts, allowing the features of the semiconductor die to be electrically accessed.

FIG. 1 schematically illustrates a conventional packaged microelectronic component assembly 10. This microelectronic component assembly 10 includes a semiconductor die 20 having an front surface 22, which bears an array of terminals 24, and a back surface 26. This microelectronic component assembly 10 is a conventional BOC package in which a back side 32 of a circuit board 30 is attached to the front surface 22 of the die 20 by adhesive members 35a and 35b. A passage 34 is formed through the entire thickness of the board 30 and permits access to the terminals 24 of the die 20 by a wire bonding machine or the like. The first adhesive member 35a extends adjacent one side of the passage 34 and the second adhesive member 35b extends along the opposite side of the passage 34.

The microelectronic component assembly 10 also includes a plurality of bond wires 40. A first set of bond wires 40a may extend from individual terminals 24 of the die 20 to a first set of bond pads 32a arranged on the front side 36 of the board 30 along a first side of the passage 34. Similarly, a series of second bond wires 40b may extend from other terminals 24 in the terminal array to a second set of bond pads 32b arranged on the front side 36 along the opposite side of the passage 34. Typically, these bond wires 40 are attached using wire-bonding machines that spool a length of wire through a capillary. A molten ball may be formed at a protruding end of the wire and the capillary may push this molten ball against one of the terminals 24, thereby attaching the terminal end 42 of the wire 40 to the die 20. The capillary moves laterally in a direction away from the bond pad 32 to which the wire 40 will be attached (referred to as the reverse motion of the capillary), then a further length of the wire will be spooled out and the board end 44 of the wire 40 will be attached to the bond pad 32. The reverse motion of the capillary is required to bend the wire into the desired shape to avoid undue stress at either the terminal end 42 or the board end 44. The need to move the capillary in the reverse direction to form the bend in the wire 40 requires significant clearance between the terminal end 42 and the inner surface of the passage 34, increasing the width W of the passage 34. The reverse motion also increases the length of each of the bond wires 40 and often requires an increased loop height L of the wire 40 outwardly from the front surface 22 of the die 20.

As noted above, most commercial microelectronic component assemblies are packaged in a mold compound 50. The mold compound 50 typically encapsulates the die 20, the adhesive members 35, the bond wires 40, and an inner portion of the board 30. A remainder of the board 30 extends laterally outwardly from the sides of the mold compound 50. In many conventional applications, the mold compound 50 is delivered using transfer molding processes in which a molten dielectric compound is delivered under pressure to a mold cavity having the desired shape. In conventional side gate molds, the mold compound will flow from one side of the cavity to the opposite side. As the front of the molten dielectric compound flows along the passage 34 under pressure, it will tend to deform the wires. This deformation, commonly referred to as "wire sweep," can cause adjacent wires 40 to abut one another, creating an electrical short. Wire sweep may also cause one of the wires 40 to bridge two adjacent leads, creating an electrical short between the two leads. These problems become more pronounced as the wire pitch becomes smaller and as thinner wires 40 are used.

To protect the bond wires, a conventional BOC package is positioned in the mold cavity with the die oriented downwardly and the substrate oriented upwardly, i.e., generally in the orientation illustrated in FIG. 1. The mold compound 50 commonly flows longitudinally along the length of the passage 34 (in a direction perpendicular to the plane of the cross sectional view of FIG. 1) to create the lower portion of the mold compound 50, then flows in the opposite direction along the back side 32 of the board 30 to create the upper portion of the mold compound. In an attempt to keep the exposed portion of the substrate's front side 36 exposed, the back side 32 of the board 30 is typically supported by pins that extend upwardly from the bottom of the mold. The pressure of the mold compound 50 flowing along the passage 34, however, can force mold compound between the front face 36 if the board 30 and the surface of the mold cavity, leaving a flash coating of the mold compound on the front face 36. This flash coating must be removed before use if the contacts 37 on the front face 36 are used to electrically couple the microelectronic component assembly 10 to another component.

DETAILED DESCRIPTION

A. Overview

Various embodiments of the present invention provide various microelectronic component assemblies and methods for forming microelectronic component assemblies. The terms "microelectronic component" and "microelectronic component assembly" may encompass a variety of articles of manufacture, including, e.g., SIMM, DRAM, flash-memory, ASICs, processors, flip chips, ball grid array (BGA) chips, or any of a variety of other types of microelectronic devices or components therefor.

For ease of understanding, the following discussion is subdivided into two areas of emphasis. The first section discusses microelectronic component assemblies in accordance with selected embodiments of the invention. The second section outlines methods in accordance with other embodiments of the invention.

B. Microelectronic Component Assemblies Having Recessed Wire Bonds

Figure 2:
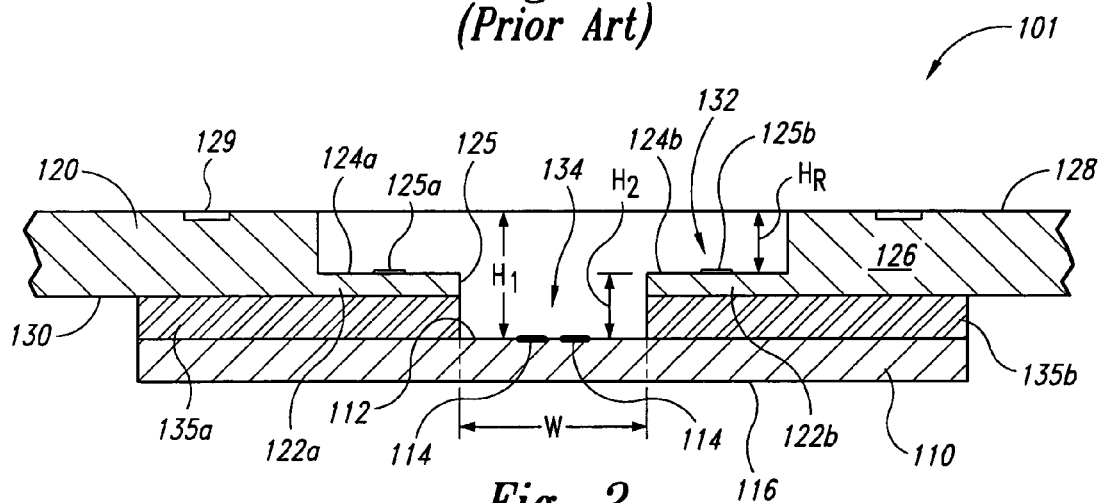
FIG. 2 is a schematic cross-sectional view of a microelectronic component subassembly in accordance with one embodiment of the invention.
Figure 3:
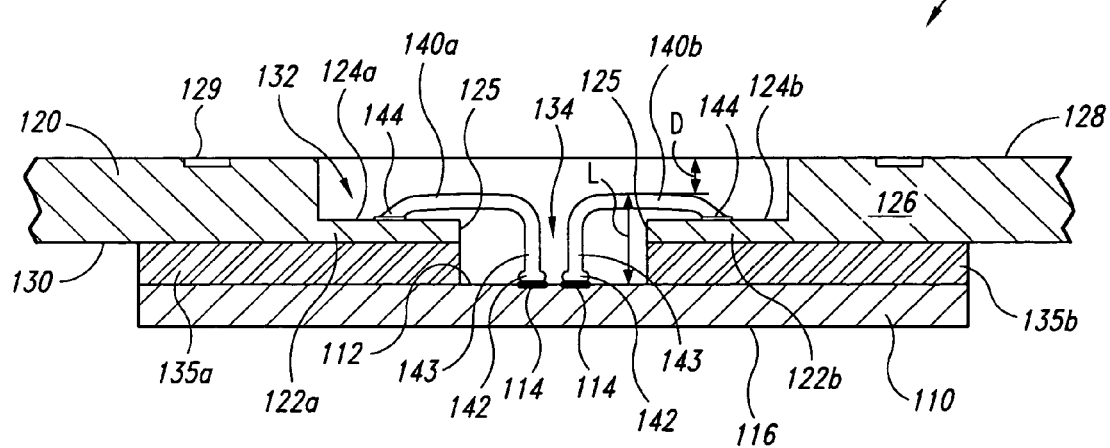
FIG. 3 is a schematic cross-sectional view of the microelectronic component subassembly of FIG. 2 after the addition of bonding wires.

FIGS. 2 and 3 schematically illustrate microelectronic component subassemblies in accordance with selected embodiments of the invention. These microelectronic components are referred to herein as subassemblies primarily because they are unlikely to be sold commercially in this fashion and instead represent an intermediate stage in the manufacture of a commercial device, e.g., the packaged microelectronic component assembly 100 of FIG. 4.

Turning first to FIG. 2, the microelectronic component subassembly 101 shown therein includes a microelectronic component 110 and a substrate 120. The microelectronic component 110 has an active surface 112 and a back surface 116. The active surface 112 carries an array of terminals 114. In one embodiment (not shown), the terminals 114 are aligned along a longitudinal midline of the microelectronic component 110. In the illustrated embodiment, the terminals 114 are arranged in a longitudinally extending array in which the terminals 114 are staggered along either side the midline of the microelectronic component. As is known in the art, such a staggered arrangement can facilitate a smaller wire pitch, increasing the maximum number of terminals 114 in a given length. Arrays in which the terminals 114 are more widely distributed on the active surface 112 may be used instead.

The microelectronic component 110 may comprise a single microelectronic component or a subassembly of separate microelectronic components. In the embodiment shown in FIG. 2, the microelectronic component 110 is typified as a single semiconductor die. In one particular implementation, the microelectronic component 110 comprises a memory element, e.g., SIMM, DRAM, or flash memory. In other implementations, the microelectronic component 110 may comprise an ASIC or a processor, for example.

The substrate 120 may include a back surface 130 and a contact surface 128 that carries a plurality of contacts 129. The distance between the back surface and the contact surface defines a thickness of a body 126 of the substrate 120. A recess 132 in the substrate extends inwardly from the contact surface 128 to a bond pad surface 124 (shown as 124a and 124b in FIG. 2) that is intermediate the back surface 130 and the contact surface 128, leaving a reduced-thickness base 122 (shown as 122a and 122b in FIG. 2) between the bond pad surface 124 and the back surface 130. A passage 134 extends through the base and may comprise an elongate slot that extends along the length of the array of terminals 114. The recess 132 extends laterally outwardly from the passage 134 in at least one area to define the bond pad surface 124.

Figure 1:
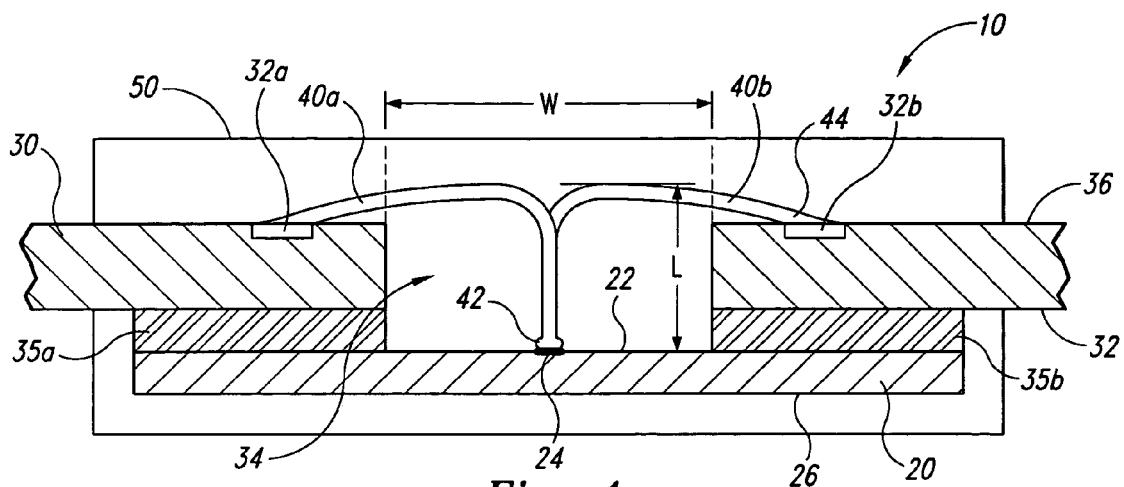
FIG. 1 is a schematic cross-sectional view of a conventional packaged microelectronic component assembly.

In the illustrated embodiment, the passage 134 may have a width W that is less than a width of the recess 132 and have a midline that generally bisects the width of the recess 132. This will define a first bond pad surface 124a extending along one edge of the passage 134 and a second bond pad surface 124b extending along the other edge of the passage 134. As explained below, aspects of the microelectronic component assembly 101 allow the width W of the recess 134 to be substantially smaller than the gap width W encountered in conventional designs such as the one shown in FIG. 1.

Any of a variety of common microelectronic component substrate materials may be used to form the substrate 120. For example, the substrate may have a laminate structure such as those used in some printed circuit boards. In one embodiment, the substrate 120 may be formed of a first ply or set of plies that define the thickness of the base 122 and a second ply or set of plies that have a thickness equal to the height of the recess $H_R$. If so desired, a printed circuit may be defined between the first and second plies to electrically connect the bond pads 125 to the contacts 129.

The substrate 120 may be attached to the microelectronic component 110 by means of an adhesive member. In the microelectronic component subassembly 101 of FIG. 2, the back surface 130 the substrate 120 is be attached to the active surface 112 of the microelectronic component 110 by a pair of spaced-apart adhesive members 135a and 135b. One adhesive member 135a may extend along one side of the passage 134 and the other adhesive member 135b may extend along the opposite side of the passage 134. In one embodiment, each of the adhesive members 135 comprises a length of a conventional die attach tape, e.g., a polyimide film such as KAPTON. In another embodiment, each adhesive member 135 comprises a quantity of a thermoplastic resin or a curable epoxy.

The contact surface 128 of the substrate 120 is spaced a first height $H_1$ from the active surface 112 of the microelectronic component 110. The bond pad surfaces 124a and 124b each may be positioned at a second height $H_2$ from the active surface 112. The first height $H_1$ is greater than the second height $H_2$, defining a recess height $H_R$ between the bond pad surfaces 124 and the contact surface 128 of the substrate 120. The relative dimensions of these heights $H_1$, $H_2$, and $H_R$ may be varied to meet the needs of a particular application.

In the embodiment shown in FIG. 2, the recess 132 defines a sharp change in thickness where the substrate body 126 adjoins the base 122. This is not necessary; the recess 132 may have a sloped, angled, or curved periphery to define a more gradual transition between the bond pad surface 124 and the contact surface 128.

FIG. 3 schematically illustrates a microelectronic component subassembly 102 that incorporates the microelectronic component subassembly 101 of FIG. 2. In particular, the device shown in FIG. 3 comprises the microelectronic component subassembly 101 of FIG. 2 with two or more bond wires attached thereto. In the cross-sectional view of FIG. 3, only two bond wires, a first bond wire 140a and a second bond wire 140b, are visible. The first bond wire 140a has a terminal end 142 bonded to one of the terminals 114 of the microelectronic component 110 and a bond pad end 144 attached to a bond pad (125a in FIG. 2) on the first bond pad surface 124a. The second bond wire 140b also has a terminal end 142 attached to one of the terminals 114 of the microelectronic component 110 and has a bond pad end 144 that is attached to a bond pad (125b in FIG. 2) on the opposite bond pad surface 124b. A terminal length 143 of each of the bond wires 140 may be positioned in the passage 134 and extend outwardly from the active surface 112 of the microelectronic component 110.

In the subassembly 102 of FIG. 3, each of the bond wires 140 has a maximum height L outwardly from the active surface 112 that is no greater than the height ($H_1$ in FIG. 2) of the contact surface 128 of the substrate 120. As a consequence, none of the bond wires 140 will extend outwardly beyond the plane of the contact surface 128. In FIG. 3, the maximum height L of the bond wires 140 is less than the height $H_1$, leaving the bond wires 140 spaced a distance D below the contact surface 128. In one particular embodiment, the recess height $H_R$ is at least about two times the diameter of the bonding wires 140. It is believed that a recess height $H_R$ of about 2-2.5 times the thickness of the bonding wire 140 will provide more than adequate manufacturing tolerances to ensure that the bond wires 140 do not extend outwardly beyond the contact surface 128.

Figure 4:
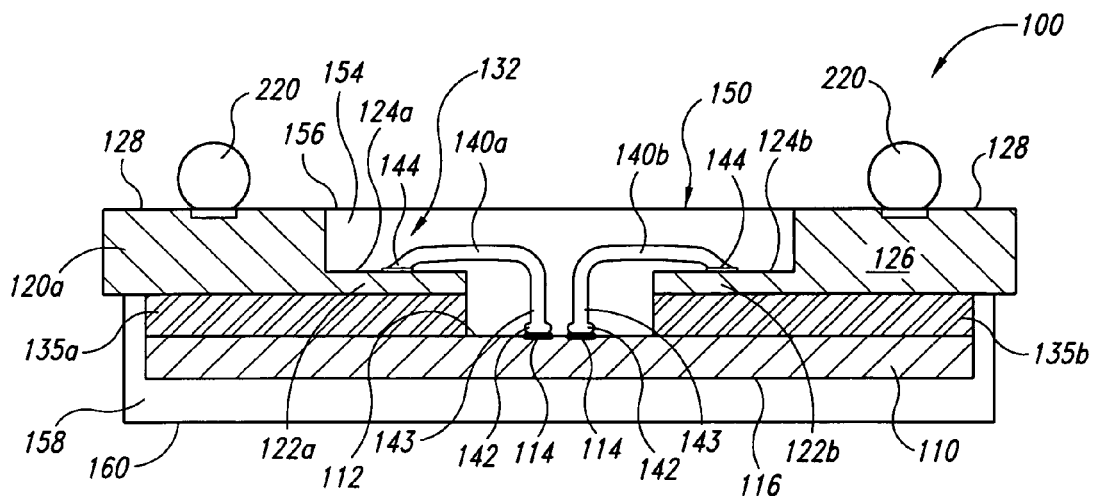
FIG. 4 is a schematic cross-sectional view of a packaged microelectronic component assembly in accordance with one embodiment of the invention that incorporates the microelectronic component subassembly of FIG. 3.

The microelectronic component subassembly 102 illustrated in FIG. 3 may be incorporated in a wide variety of microelectronic component assemblies. FIG. 4 illustrates one particular microelectronic component assembly 100 that is manufactured from the microelectronic component subassembly 102 of FIG. 3. The microelectronic component assembly 100 also includes a dielectric matrix 150 that covers the bond wires 140, the microelectronic component 110, and a portion of the substrate 120, leaving the contacts 129 of the contact surface 128 exposed for access instead of covered by the dielectric matrix 150. In the illustrated embodiment, the dielectric matrix 150 includes a first portion 154 and a second portion 158. The first portion 154 substantially fills the recess 132 and the passage (134 in FIG. 2). The second portion 158 defines a back surface 160 of the assembly 100. The first and second portions 154 and 158 may be formed during the same manufacturing step, e.g., in a single transfer molding operation. In another embodiment, the first portion 152 and the second portion 158 are formed in separate manufacturing steps.

In one embodiment, the first portion 154 of the dielectric matrix 150 may have a maximum height outwardly from the active surface 112 of the microelectronic component that is no greater than the height ($H_1$ in FIG. 2) of the contact surface 128 of the substrate 120. In the particular implementation illustrated in FIG. 4, the dielectric matrix 150 has an outer surface 156 that is substantially coplanar with the contact surface 128. This presents the microelectronic component assembly 100 with a relatively flat outer surface that comprises the outer surface 156 of the dielectric matrix 150 and the contact surface 128 of the substrate 120. In an alternative embodiment, the dielectric outer surface 156 is recessed below the contact surface 128, but still substantially encapsulates the bond wires 140.

The dielectric matrix 150 may be formed of any material that will provide suitable protection for the elements within the matrix 150. It is anticipated that most conventional, commercially available microelectronic packaging mold compounds may be useful as the dielectric matrix 150. Such mold compounds typically comprise a dielectric thermosetting plastic that can be heated to flow under pressure into a mold cavity of a transfer mold. In other embodiments, the dielectric matrix 150 may comprise a more flowable dielectric resin that can be applied by wicking under capillary action instead of delivered under pressure in a transfer mold.

As noted previously, terminal pitch and bond wire pitch in packaged microelectronic components (e.g., microelectronic component 10 of FIG. 1) are decreasing over time. The requisite smaller wire diameters and closer spacing exacerbates the previously noted problems associated with wire sweep. The microelectronic component assembly 100 of FIG. 4 can reduce some of these problems. Having the bond pads 125 (FIG. 2) of the substrate 120 positioned closer to the active surface 112 of the microelectronic component 110 reduces the spacing necessary for the reverse motion of the capillary of a wire bonding machine. This, in turn, permits the surfaces of the inner periphery of the passage (134 in FIGS. 2 and 3) to be positioned closer to one another, reducing the width (W in FIG. 2) of the opening through the substrate 120.

Because the bond wires 140 need not extend outwardly from the active surface 112 as far or extend laterally as far to reach the bond pads 125 of the substrate 120, the length of each of the bonding wires 140 can be materially reduced. Wire sweep increases as the bonding wires become longer. Shortening the bond wires 140, therefore, will reduce the wire sweep encountered for bond wires 140 having the same diameter, or it may permit the use of thinner (and cheaper) bond wires 140 that experience about the same degree of wire sweep.

The microelectronic component assembly 100 of FIG. 4 also includes an array of conductive structures 220 (only two of which are visible in this view). Each of the conductive structures 220 is carried on and is in electrical contact with one of the contacts 129 of the substrate 120. In FIG. 4, these conductive structures are typified as solder balls. Other suitable conductive structures may include conductive epoxy bumps or pillars, conductor-filled epoxy, or an anisotropic "Z-axis" conductive elastomer. These conductive structures 220 may be used to electrically connect the contacts 129 of the substrate 120 to another microelectronic component, e.g., a substrate such as a printed circuit board, using conventional flip chip or BGA techniques.

C. Methods of Manufacturing Microelectronic Component Assemblies

As noted above, other embodiments of the invention provide methods of manufacturing microelectronic component assemblies. In the following discussion, reference is made to the particular microelectronic component assemblies shown in FIGS. 2-4. It should be understood, though, that reference to these particular microelectronic component assemblies is solely for purposes of illustration and that the method outlined below is not limited to any particular microelectronic component assembly shown in the drawings or discussed in detail above.

In one embodiment, a method of the invention may include juxtaposing an active surface 112 of a microelectronic component 110 with the back surface 130 of a substrate 120. This may include aligning the passage 134 in the base 122 with the terminals 114 of the microelectronic component 110. Once the substrate 120 is in the desired position with respect to the microelectronic component 110, the substrate 120 may be attached to the active surface 112 of the microelectronic component 110 with the array of terminals 114 accessible through the passage 134. In one embodiment, this attachment is accomplished via a pair of adhesive members 135. If the adhesive members 135 each comprise a die attach tape, the first adhesive member 135a may be attached to the active surface 112 along a first longitudinal side of the array of terminals 114 and the second die attach tape 135b may be attached to the active surface 112 along the opposite side of the array of terminals. The substrate 120 may then be brought into contact with the outer surfaces of the adhesive members 135, thereby attaching the substrate 120 to the microelectronic component 110.

In one embodiment, at least two bond wires 140 are used to electrically couple the microelectronic component 110 to the substrate 120. Using a conventional, commercially available wire bonding machine, a terminal end 142 of a first bond wire 140a may be attached to one of the terminals 114 of the microelectronic component 110 and the bond pad end 144 of the first bond wire 140a may be bonded to a bond pad 125a on the bond pad surface 124 of the substrate 120. In a similar fashion, a second bond wire 140b may be attached to a second terminal 114 of the microelectronic component 110 and to another bond pad 125b. In one embodiment, each of the bond wires 140 has a maximum height outwardly from the active surface 112 of the microelectronic component 110 that is less than the height $H_1$ of the contact surface 128.

A dielectric matrix 150 may be used to protect the microelectronic component subassembly 102. For example, the microelectronic component assembly 100 shown in FIG. 4 may be formed by positioning the microelectronic component subassembly 102 in a transfer mold with the microelectronic component 110 and the bond wires 140 positioned in a mold cavity. A molten dielectric resin may then be delivered under pressure to fill the mold cavity, yielding a dielectric matrix 150 such as that shown in FIG. 4.

Figure 5:
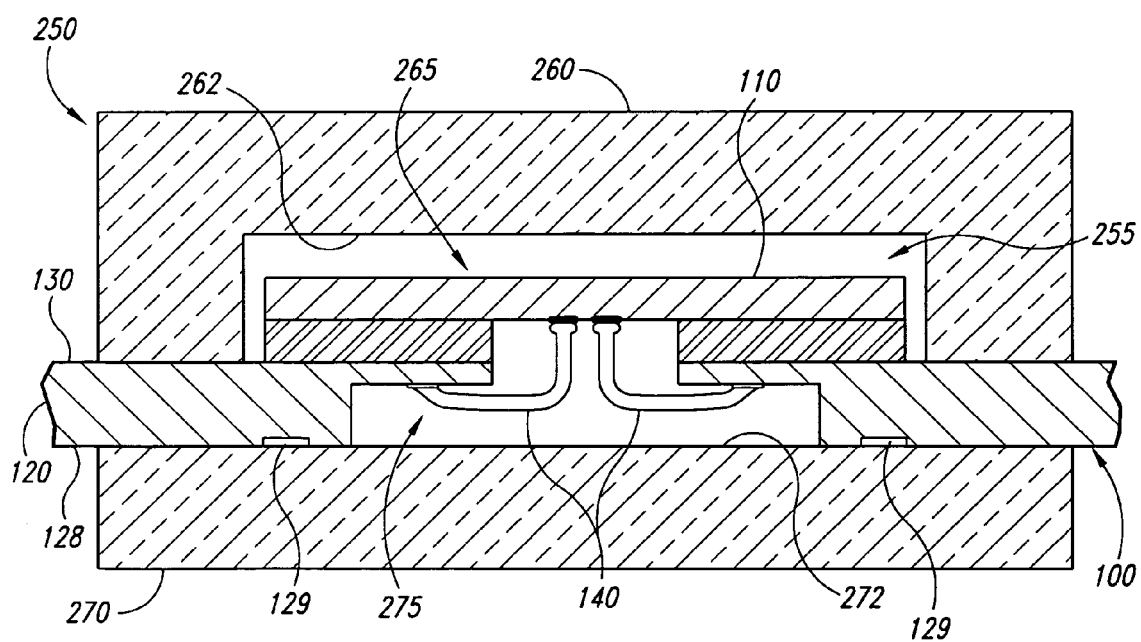
FIG. 5 is a schematic cross-sectional view of a stage in the manufacture of the packaged microelectronic component subassembly of FIG. 4.

FIG. 5 schematically illustrates a stage in a transfer molding operation in accordance with one embodiment of the invention. In this illustration, the microelectronic component subassembly 102 of FIG. 3 is positioned in a mold cavity 255 of a mold 250. The mold may comprise an upper mold element 260 having an inner surface that defines an upper mold cavity surface 262 and a lower mold element 270 having an inner surface that defines a lower mold cavity surface 272.

The back surface 130 of the substrate 120 may be spaced from the upper mold cavity surface 262, defining a first void 265 of the mold cavity 255. The contact surface 128 of the microelectronic component subassembly 102 may be oriented downwardly and disposed in contact with the lower mold cavity surface 272. This defines a second void 275 of the mold cavity 255 between the bond pad surface 124 and the lower mold cavity surface 272. The second void 275 is further bounded by the recess (132 in FIG. 2) and the passage (134 in FIG. 2) of the substrate 120 and the active surface (112 in FIG. 2) of the microelectronic component 110.

The first and second voids 265 and 275 may be substantially filled with a dielectric matrix (150 in FIG. 4) by delivering a molten mold compound to the mold cavity under pressure. In one particular implementation, the mold compound is delivered to the first void 265 before it is delivered to the second void. For example, the mold compound may be delivered adjacent an end of the first void 265, flow along the length of the first void 265 (perpendicular to the plane of the cross section of FIG. 5), then flow in the opposite direction to fill the second void 275. The weight of the microelectronic component subassembly 102 will help keep the contact surface 128 flush with the lower mold cavity surface 272. Delivering the mold compound to the first void 265 before delivering it to the second void 275 will further urge the contact surface 128 against the lower mold cavity surface 272, significantly limiting the likelihood that the mold compound will squeeze between the contact surface 128 and the lower mold cavity surface 272 to foul the contacts 129. In another embodiment, both voids 265 and 275 may be filled simultaneously. The pressure of the mold compound in the first void 265 will still help limit intrusion of the mold compound onto the contacts 129.

If necessary, any inadvertent flash coating of the dielectric matrix 150 on the contact surface 128 of the substrate 120 may be removed by etching or grinding. As noted above, though, this is less likely to occur than in conventional, substrate-up molding operations. The conductive structures 220 (FIG. 5) may be applied to some or all of the contacts 129 of the substrate 120 to define an array of conductive structures 220. The conductive structures 220 may be deposited using a solder mask/etch process, screen printing, or any of a number of other conventional techniques used in depositing solder balls, conductive epoxies, and other conductive structures.

The above-detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, whereas steps are presented in a given order, alternative embodiments may perform steps in a different order. The various embodiments described herein can be combined to provide further embodiments. In general, the terms used in the following claims should not be construed to limit the invention to the specific embodiments disclosed in the specification, unless the above-detailed description explicitly defines such terms.

We claim:

1. A method of manufacturing a microelectronic component assembly, comprising:

juxtaposing a back surface of a substrate with an active surface of a microelectronic component, wherein the substrate has a body, a reduced-thickness base portion, and a passage through the base, the body having a first thickness and the base portion having a second thickness that is less than the first thickness, and the active surface of the microelectronic component carries an array of terminals that is accessible through the passage;

attaching the back surface of the substrate to the active surface of the microelectronic component with the body of the substrate having a contact surface that is spaced a body height outwardly from the active surface of the microelectronic component;

attaching a first bond wire to a first terminal of the array and to a first bond pad carried by the base portion of the substrate, the first bond wire having a maximum height outwardly from the active surface that is less than the body height;

attaching a second bond wire to a second terminal of the array and to a second bond pad carried by the base portion of the substrate, the second bond wire having a maximum height outwardly from the active surface that is less than the body height;

positioning the substrate in a mold cavity with the contact surface against a lower mold surface of the mold cavity, leaving a first void between the back surface and the upper mold surface and a second void between the active surface and the bottom mold surface; and encapsulating the first and second bonding wires in a dielectric matrix by substantially filling the first and second voids of the mold cavity with the dielectric matrix while the contact surface is urged against the lower mold surface.

2. The method of claim 1 further comprising covering at least a portion of each of the first and second bond wires with a dielectric matrix.

3. The method of claim 1 further comprising covering at least a portion of each of the first and second bond wires with a dielectric matrix that has a maximum height outwardly from the active surface of the microelectronic component that is no greater than the body height.

4. The method of claim 1 further comprising covering at least a portion of each of the first and second bond wires with a dielectric matrix that has a maximum height outwardly from the active surface of the microelectronic component that is less than the body height.

5. The method of claim 1 further comprising substantially filling the recess with a dielectric matrix that has a maximum height outwardly from the active surface of the microelectronic component that is no greater than the body height.

6. The method of claim 1 further comprising depositing a conductive structure on a contact surface of the body of the substrate.

7. A method of manufacturing a microelectronic component assembly, comprising:

attaching a back surface of a substrate to an active surface of a microelectronic component, wherein the substrate has at least one contact carried on a contact surface that is spaced from the back surface, at least one bond pad carried by a bond pad surface that is intermediate the back surface and the contact surface, and a passage that extends between the bond pad surface and the back surface;

connecting the bond pad to a component terminal carried by the active surface of the microelectronic component with a bond wire that extends through the passage;

positioning the substrate in a mold cavity with the contact surface disposed against a lower mold surface of the mold cavity and with the back surface spaced from an upper mold surface of the mold cavity, leaving a first void between the back surface and the upper mold surface and a second void between the bond pad surface and the bottom mold surface;

substantially filling the first and second voids of the mold cavity with a dielectric matrix such that a first portion of the dielectric matrix in the first void urges the substrate contact surface against the bottom mold surface as a second portion of the dielectric fills the second void.

8. The method of claim 7 wherein the bond wire is formed to extend outwardly from the active surface of the microelectronic component to a height that is no greater than a height of the contact surface from the active surface.

9. The method of claim 7 wherein substantially filling the second void leaves a maximum dielectric matrix height outwardly from the active surface of the microelectronic component that is no greater than a height of the contact surface from the active surface.

10. The method of claim 7 wherein the substrate includes a recess extending inwardly from the contact surface to the bond pad surface and the second void includes the recess.

11. The method of claim 7 wherein substantially filling the second void substantially encapsulates the bonding wire within the dielectric matrix.

12. The method of claim 7 wherein the bond pad is a first bond pad, the component terminal is a first component terminal, and the bond wire is a first bond wire, and wherein the bond pad surface carries a second bond pad and the microelectronic component carries a second component terminal, the method further comprising connecting the second bond pad to the second component terminal with a second bond wire.

13. The method of claim 12 wherein substantially filling the second void substantially encapsulates the bonding wire within the dielectric matrix.

14. The method of claim 12 wherein substantially filling the first and second voids of the mold cavity with the dielectric matrix includes delivering the first portion of the dielectric matrix to the first void before delivering the second portion of the dielectric matrix to the second void.

15. The method of claim 14 wherein substantially filling the first and second voids of the mold cavity with the dielectric matrix includes:

delivering the first portion of the dielectric matrix to the first void adjacent an end of the first void;

flowing the first portion of the dielectric matrix along a length of the first void in a first direction;

thereafter, delivering the second portion of the dielectric matrix to an end of the second void;

flowing the second portion of the dielectric matrix along a length of the second void in a second direction generally opposite of the first direction.

16. The method of claim 12 wherein substantially filling the first and second voids of the mold cavity with the dielectric matrix includes simultaneously delivering the first and second portions of the dielectric matrix to the first and second voids.

17. A method of manufacturing a microelectronic component assembly, comprising:

attaching a back surface of a substrate to an active surface of a microelectronic component, the active surface carrying a component terminal, wherein the substrate has at least one contact carried on a contact surface opposite the back surface, at least one bond pad carried by a bond pad surface that is intermediate the back surface and the contact surface, and a passage that extends between the bond pad surface and the back surface;

connecting the bond pad to the component terminal of the microelectronic component with a bond wire that extends through the passage;

positioning the substrate in a mold cavity with the contact surface disposed against a lower mold surface of the mold cavity and with the back surface spaced from an upper mold surface of the mold cavity, leaving a first void between the back side and the upper mold surface and a second void between the bond pad surface and the bottom mold surface;

delivering a first portion of a dielectric matrix to the first void in the mold cavity;

urging the contact surface of the substrate against the bottom mold surface with the first portion of the dielectric matrix.

18. The method of claim 17, further comprising delivering a second portion of the dielectric matrix to the second void in the mold cavity after the first portion of the dielectric matrix is delivered to the first void.

19. The method of claim 17, further comprising delivering a second portion of the dielectric matrix to the second void in the mold cavity simultaneously as the first portion of the dielectric matrix is delivered to the first void.

20. The method of claim 17, wherein delivering a first portion of a dielectric matrix to the first void in the mold cavity further includes flowing the first portion of the dielectric matrix along a length of the first void in a first direction, further comprising delivering a second portion of the dielectric matrix to the second void and flowing the second portion of the dielectric matrix along a length of the second void in a second direction opposite the first direction.

* * * * *